(12) United States Patent
Park et al.

(10) Patent No.: US 8,684,780 B2
(45) Date of Patent: Apr. 1, 2014

(54) ORGANIC LIGHT EMITTING DIODE DISPLAY, DISPLAY DEVICE INCLUDING THE SAME, AND ASSOCIATED METHODS

(75) Inventors: Soon-Ryong Park, Suwon-si (KR);
Hee-Seong Jeong, Suwon-si (KR);
Woo-Suk Jung, Suwon-si (KR);
Hee-Chul Jeon, Suwon-si (KR);
Eun-Ah Kim, Suwon-si (KR); Noh-Min Kwak, Suwon-si (KR); Chul-Woo Jeong, Suwon-si (KR); Joo-Hwa Lee, Suwon-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 1078 days.

(21) Appl. No.: 12/461,701

(22) Filed: Aug. 21, 2009

(65) Prior Publication Data
US 2010/0052528 A1   Mar. 4, 2010

(30) Foreign Application Priority Data
Aug. 26, 2008 (KR) .................. 10-2008-0083394

(51) Int. Cl.
*H01J 9/00* (2006.01)
*H01J 9/24* (2006.01)

(52) U.S. Cl.
USPC .......................... 445/24; 313/504

(58) Field of Classification Search
USPC .............. 257/40, 72, 98–100, 642–643, 759;
313/498–512; 315/169.1, 169.3;
427/58, 64, 66, 532–535, 539;
428/690–691, 917; 438/26–29, 34, 82,
438/455; 445/24–25
See application file for complete search history.

(56) References Cited

U.S. PATENT DOCUMENTS

| | | | |
|---|---|---|---|
| 2004/0135499 A1* | 7/2004 | Cok | 313/506 |
| 2004/0212296 A1* | 10/2004 | Nakamura et al. | 313/504 |
| 2005/0092984 A1* | 5/2005 | Yamazaki et al. | 257/40 |
| 2006/0091418 A1* | 5/2006 | Chew | 257/100 |
| 2006/0255706 A1* | 11/2006 | Mitsui et al. | 313/112 |
| 2008/0007155 A1* | 1/2008 | Adachi | 313/498 |

FOREIGN PATENT DOCUMENTS

JP   2005-148473   * 11/2003 ............... G02B 5/30

* cited by examiner

*Primary Examiner* — Donald Raleigh
(74) *Attorney, Agent, or Firm* — Lee & Morse, P.C.

(57) ABSTRACT

An organic light emitting diode (OLED) display, a display device including the same, and associated methods, the OLED display including a substrate member, an organic light emitting element on the substrate member, and a liquid crystal polymer layer on the organic light emitting element, wherein the liquid crystal polymer layer is configured to delay a phase of light passing therethrough.

7 Claims, 4 Drawing Sheets

ORGANIC LIGHT EMITTING DIODE DISPLAY, DISPLAY DEVICE INCLUDING THE SAME, AND ASSOCIATED METHODS

BACKGROUND

1. Technical Field

Embodiments relate to an organic light emitting diode display, a display device including the same, and associated methods.

2. Description of the Related Art

An organic light emitting diode (OLED) display may include a plurality of organic light emitting diodes, each of which may include a hole-injection electrode, an organic emission layer, and an electron-injection electrode. The organic emission layer may emit light using energy generated when excitons drop from an exited state to a ground state, after the excitons are generated by the combination of electrons and holes. The OLED display may form images using light emitted from the organic emission layer.

As described above, the OLED display may have a self emissive characteristic and does not need an additional light source, unlike, e.g., a liquid crystal display (LCD). Therefore, the thickness and weight of a display may be reduced. Also, since the OLED display may have high definition characteristics, e.g., low power consumption, high luminance, and a high response speed, OLED displays have been receiving attention as a next generation display device.

In general, at least one of the hole injection electrode, the electron injection electrode, and metal wires in the OLED display may reflect light entering from the outside, i.e., external light. Therefore, the OLED display may have a problem in that the display and contrast of a black color may deteriorate due to the reflection of external light, especially if the OLED display is used in high ambient light conditions.

There is a need to reduce or eliminate the reflection of external light. Furthermore, an OLED display may be manufactured to be very thin relative to other display technologies. Thus, it is desirable that a solution for reducing or eliminating the reflection of external light also be thin, so as to maintain a small overall thickness of the OLED display, and also be combinable with an OLED substrate without damage thereto.

SUMMARY

Embodiments are therefore directed to an organic light emitting diode display, a display device including the same, and associated methods, which substantially overcome the problems due to the limitations and disadvantages of the related art.

It is therefore a feature of an embodiment to provide an OLED display having improved visibility by suppressing reflection of external light.

It is therefore another feature of an embodiment to provide a display device having minimized overall thickness.

At least one of the above and other features and advantages may be realized by providing an organic light emitting diode (OLED) display, including a substrate member, an organic light emitting element on the substrate member, and a liquid crystal polymer layer on the organic light emitting element, wherein the liquid crystal polymer layer is configured to delay a phase of light passing therethrough.

The liquid crystal polymer layer may delay the phase of light passing therethrough by as much as ¼ wavelength.

The OLED display may further include a sealing member arranged opposite to the substrate member and covering the organic light emitting element, wherein the liquid crystal polymer layer is disposed between the organic light emitting element and the sealing member.

The OLED display may further include a polarizing plate disposed between the liquid crystal polymer layer and the sealing member, wherein the polarizing plate linearly polarizes light.

The OLED display may further include a polarizing plate on the sealing member, wherein the polarizing plate linearly polarizes light.

The OLED display may further include a sealing member arranged opposite to the substrate member and covering the organic light emitting element, wherein the sealing member is disposed between the organic light emitting element and the liquid crystal polymer layer.

The OLED display may further include a polarizing plate on the liquid crystal polymer layer, wherein the polarizing plate linearly polarizes light.

The liquid crystal polymer layer may have a thickness of less than about 4 μm.

At least one of the above and other features and advantages may also be realized by providing a display device, including a housing, a substrate member in the housing, organic light emitting elements on the substrate member, and a liquid crystal polymer layer on the organic light emitting element, wherein the liquid crystal polymer layer is configured to delay a phase of light passing therethrough.

At least one of the above and other features and advantages may also be realized by providing a method of manufacturing a display device, including providing a housing, providing a substrate member in the housing, forming an organic light emitting element on the substrate member, and forming a liquid crystal polymer layer on the organic light emitting element, wherein the liquid crystal polymer layer is configured to delay a phase of light passing therethrough.

The liquid crystal polymer layer may delay the phase of light passing therethrough by as much as ¼ wavelength.

The method may further include forming a sealing member opposite to the substrate member and covering the organic light emitting element, wherein the liquid crystal polymer layer is disposed between the organic light emitting element and the sealing member.

The method may further include forming a polarizing plate between the liquid crystal polymer layer and the sealing member, wherein the polarizing plate linearly polarizes light.

The method may further include forming a polarizing plate on the sealing member, wherein the polarizing plate linearly polarizes light.

The method may further include forming a sealing member opposite to the substrate member and covering the organic light emitting element, wherein the sealing member is disposed between the organic light emitting element and the liquid crystal polymer layer.

The method may further include forming a polarizing plate on the liquid crystal polymer layer, wherein the polarizing plate linearly polarizes light.

The liquid crystal polymer layer may have a thickness of less than about 4 μm.

Forming the liquid crystal polymer may include coating a molten liquid crystal polymer on the organic light emitting element, orienting the molten liquid crystal polymer by applying an electric field, and solidifying the liquid crystal polymer.

BRIEF DESCRIPTION OF THE DRAWINGS

The above and other features and advantages will become more apparent to those of ordinary skill in the art by describing in detail exemplary embodiments thereof with reference to the attached drawings, in which.

DETAILED DESCRIPTION

Figure 1:
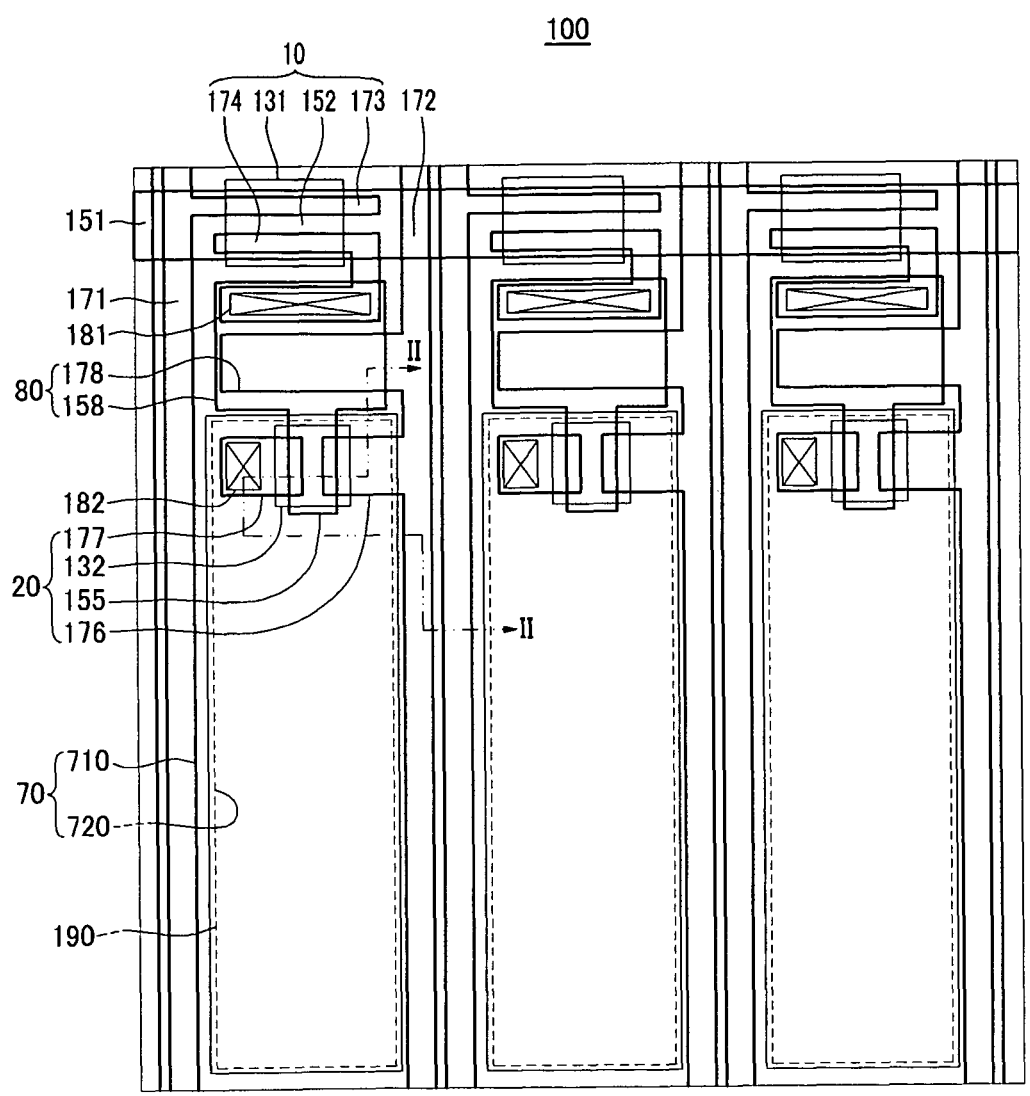
FIG. 1 illustrates a layout view of an OLED display according to an embodiment.

Korean Patent Application No. 10-2008-0083394, filed on Aug. 26, 2008, in the Korean Intellectual Property Office, and entitled, "Organic Light Emitting Diode Display," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an $n^{th}$ member, where n is greater than 3, whereas the expression "at least one selected from the group consisting of A, B, and C" does not.

As used herein, the expression "or" is not an "exclusive or" unless it is used in conjunction with the term "either." For example, the expression "A, B, or C" includes A alone; B alone; C alone; both A and B together; both A and C together; both B and C together; and all three of A, B, and C together, whereas the expression "either A, B, or C" means one of A alone, B alone, and C alone, and does not mean any of both A and B together; both A and C together; both B and C together; and all three of A, B, and C together.

As used herein, the terms "a" and "an" are open terms that may be used in conjunction with singular items or with plural items. For example, the term "a reflective material" may represent a single compound, e.g., aluminum, or multiple compounds in combination, e.g., aluminum mixed with magnesium.

Hereinafter, embodiments will be described more fully with reference to the accompanying drawings, in which exemplary embodiments are shown. As those skilled in the art would realize, the described embodiments may be modified in various different ways, all without departing from the spirit or scope.

It will be understood that when an element is referred to as being "directly on" another element, there are no intervening elements present. To clearly explain the embodiments, portions having no connection to the explanation are omitted.

Also, an embodiment may be representatively described using the same reference numerals throughout for like constituent elements having the same structure in various exemplary embodiments. Other embodiments may only be described based on differences from the first embodiment.

Although the accompanying drawings illustrate an active matrix (AM) type OLED display having a 2 Tr-1 Cap structure in which two thin film transistors (TFT) and one capacitor may be disposed in a pixel, embodiments are not limited thereto. Therefore, the OLED display may have various structures. For example, the OLED display may include more than three TFTs and more than two capacitors at one pixel and may further include additional wires.

Here, the pixel is a minimum unit for displaying an image, and the OLED display may display an image through a plurality of pixels.

Figure 2:
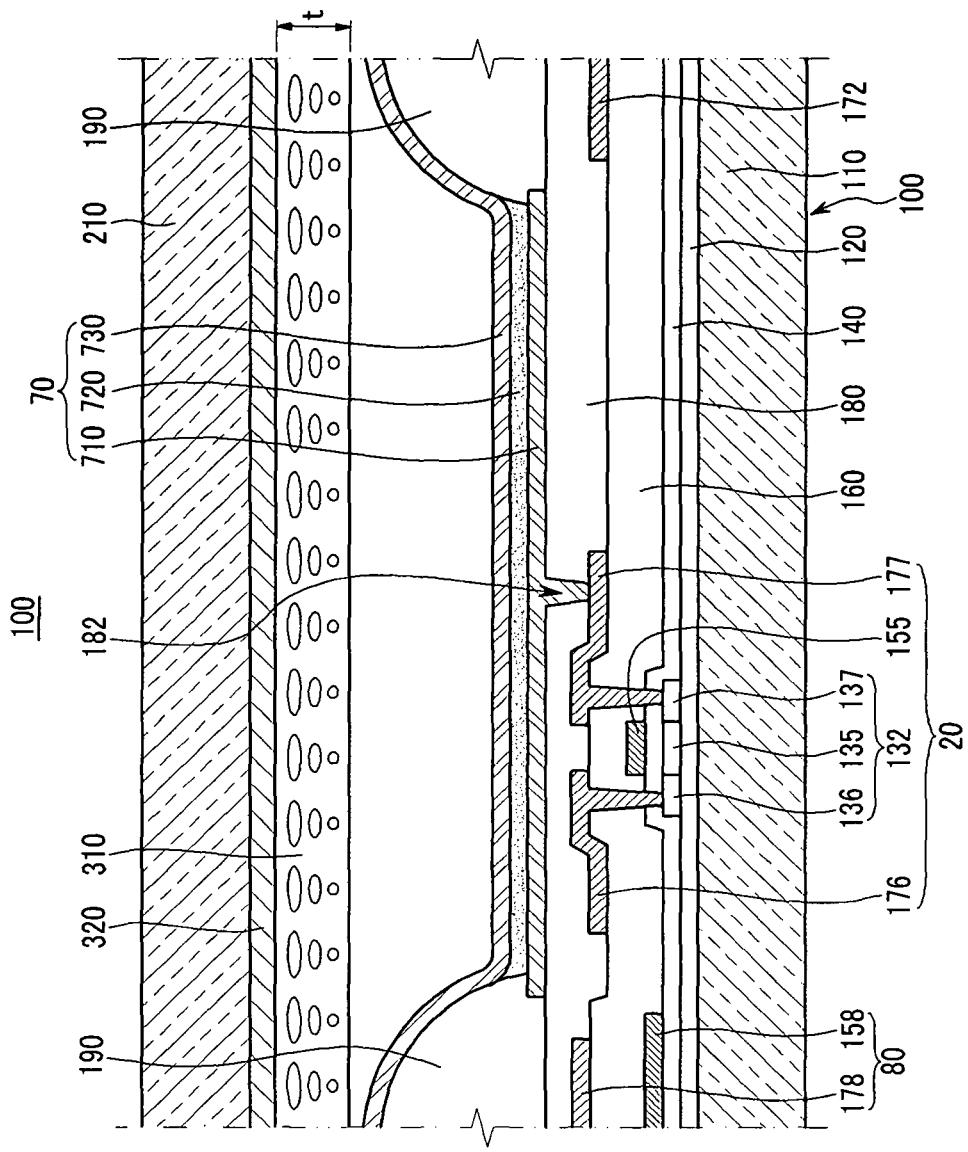
FIG. 2 illustrates a cross-sectional view of the OLED display of FIG. 1 taken along the line II-II.

With reference to FIG. 1 and FIG. 2, an OLED display according to an embodiment will be described.

As illustrated in FIG. 1, the OLED display 100 according to an embodiment may include a switching TFT 10, a driving TFT 20, a capacitor 80, and an organic light emitting element 70 in one pixel. The OLED display 100 may further include a gate line 151 disposed along a first direction, a data line 171 crossing, and insulated from, the gate line 151, and a common power line 172. Here, one pixel may be defined by the gate line 151, the data line 171, and the common power line 172 as boundaries.

The organic light emitting element 70 may include a pixel electrode 710, an organic emission layer 720 on the pixel electrode 710, and a common electrode (730, FIG. 2) on the organic emission layer 720. Here, the pixel electrode 710 may be a hole injection electrode that is an anode (+), and the common electrode 730 may be an electron injection electrode that is a cathode (−). However, embodiments are not limited thereto. The pixel electrode 710 may be a cathode and the common electrode 730 may be an anode according to a driving method of the OLED display 100. Holes and electrons may be injected into the organic emission layer 720 from the pixel electrode 710 and the common electrode 730, respectively. Light may be emitted when excitons generated by the combination of the injected holes and electrons drop from an exited state to a ground state. The light emitted from the organic light emitting element 70 may be one of red, green, or blue, although embodiments are not limited thereto. Pixels emitting light of various colors, e.g., red, green, and blue, may be arranged and driven together so as to form images having, e.g., thousands, millions, or more colors.

The switching TFT 10 may include a switching semiconductor layer 131, a switching gate electrode 152, a switching source electrode 173, and a switching drain electrode 174. The driving TFT 20 may include a driving semiconductor layer 132, a driving gate electrode 155, a driving source electrode 176, and a driving drain electrode 177.

The capacitor 80 may include a first sustain electrode 158, a second sustain electrode 178, and a gate insulating layer (140, FIG. 2) interposed therebetween.

The switching TFT 10 may be used as a switch to select a pixel to emit light. The switching gate electrode 152 may be connected to the gate line 151. The switching source electrode 173 may be connected to the data line 171. The switching drain electrode 174 may be separated from the switching source electrode 173 and may be connected to the first sustain electrode 158.

The driving TFT 20 may apply a driving power to drive an organic emission layer 720 of an organic light emitting element 70 in the selected pixel for emitting light. The driving gate electrode 155 may be connected to the first sustain electrode 158. The driving source electrode 176 and the second sustain electrode 178 may be connected to the common power line 172. The driving drain electrode 177 may be connected to the pixel electrode 710 of the organic light emitting element 70 through a contact hole 182.

According to the described structure, the switching TFT 10 may be driven by a gate voltage applied to the gate line 151 and may transfer a data voltage applied to the data line 171 to the driving TFT 20. The capacitor 80 may store a voltage corresponding to a voltage difference between the common voltage applied to the driving TFT 20 from the common power line 172 and the data voltage transferred from the switching TFT 10. Current corresponding to the voltage stored in the capacitor may flow to the organic light emitting element 70 through the driving TFT, thereby emitting light.

As shown in FIG. 2, the OLED display 100 may further include a liquid crystal polymer layer 310. Also, the OLED display 100 may further include a sealing member 210, a polarizing plate 320, and a pixel defining layer 190.

In FIG. 2, the dimensions of the liquid crystal polymer layer 310 are exaggerated. The liquid crystal polymer layer 310 may have a thickness (t) significantly thinner than that of the sealing member 210, as well as thinner than that of the polarizing plate 320.

The liquid crystal polymer layer 310 may be formed on the organic light emitting element 70. In an implementation, the liquid crystal polymer layer 310 may extend continuously across a plurality of organic light emitting elements 70, e.g., across multiple red, multiple green, and multiple blue organic light emitting elements 70. The liquid crystal polymer layer 310 may delay a phase of light that passes through the liquid crystal polymer layer 310. In an embodiment, the liquid crystal polymer layer 310 may delay the phase of light up to about ¼ wavelength thereof. In an implementation, the liquid crystal polymer layer 310 may be formed to have a thickness of less than about 4 μm. That is, the liquid crystal polymer layer 310 may have a thickness of less than about 4 μm, and may delay the phase of light passing through the liquid crystal polymer layer 310.

The liquid crystal polymer may be a large molecule material, and it may be plastic that may be deformed while sustaining a crystallization state thereof, even in a melting state like liquid crystal. The liquid crystal polymer may be made of at least one of thermoplastic, thermosets, and heat- or UV-curable resin. For example, the main raw materials of the liquid crystal polymer may include P-hydroxyzine benzoic acid, various diols, and aromatic dicarboxylic acid. In an implementation, most of the liquid crystal polymer may be made of an aromatic polyester. Also, the polymer may tend to have a, e.g., bar or oblong shape, such that the liquid crystal polymer may not only be deformable like plastic but may also have a high level of orientation even in a melting state.

A sealing member 210 may seal the TFTs 10 and 20 and the organic light emitting element 70 on the substrate member 110, protecting them from the outside. In an embodiment, the sealing member 210 may also cover the liquid crystal polymer layer 310. That is, the liquid crystal polymer layer 310 may be disposed between the sealing member 210 and the organic light emitting element 70. As illustrated in FIG. 2, the liquid crystal polymer layer 310 may be comparatively adjacent to the sealing member 210 but the embodiments are not limited thereto. Therefore, the liquid crystal polymer layer 310 may be comparatively adjacent to the organic light emitting element 70.

The polarizing plate 320 may linearly polarize light that passes through it. In an embodiment, the polarizing plate 320 may be disposed between the liquid crystal polymer layer 310 and the sealing member 210. That is, the sealing member 210 may also cover the polarizing plate 320. The polarizing plate 320 may be made of material including, e.g., triacetate cellulose (TAC). The linear polarized light from the polarizing plate 320 may be changed to, e.g., elliptical or circular polarized light, while passing through the liquid crystal polymer layer 310. In an implementation, the polarizing plate 320 may extend continuously across a plurality of organic light emitting elements 70, e.g., across multiple red, multiple green, and multiple blue organic light emitting elements 70.

The pixel defining layer 190 may have an opening that exposes the pixel electrode 710. The organic emission layer 720 may be substantially disposed in an opening of the pixel defining layer 190. That is, in a pixel, an area where the pixel defining layer 190 is formed may cover the substrate except for an area including the organic emission layer 720.

As described above, the OLED display 100 according to an embodiment may have improved display characteristics while simultaneously minimizing overall thickness.

In more detail, the polarizing plate 320 and the liquid crystal polymer layer 310 may operate as to filter reflected light, i.e., to reduce or eliminate external light, i.e., light entering from the outside, from being reflected back out of the OLED region, while operating to pass light generated from the organic light emitting element 70 to the outside, thereby improving visibility. Thus, the OLED display 100 may have improved visibility by suppressing reflection of external light.

Also, since the liquid crystal polymer layer 310 may have a comparatively low thickness, e.g., thinner than about 4 μm, the overall thickness of the OLED display 100 may be advantageously reduced.

Also, the overall thickness of the OLED display 100 may be further reduced by disposing the liquid crystal polymer layer 310 and the polarizing plate 320 between the organic light emitting element 70 and the sealing member 210.

Referring to FIG. 2, a structure of an OLED display 100 according to an embodiment will now be described in detail. FIG. 2 illustrates an OLED display 100 based on a driving TFT 20, a organic light emitting element 70, and a capacitor 80.

Hereinafter, a structure of the driving TFT 20 will be described. Also, the switching TFT 10 will be described shortly based on differences from the driving TFT 20.

The substrate member 110 may be a dielectric substrate made of, e.g., glass, quartz, ceramic, or plastic. However, the embodiments are not limited thereto, and the substrate member 110 may also be formed of, e.g., a metallic substrate including stainless steel.

A buffer layer 120 may be formed on the substrate member 110. The buffer layer 120 may include various materials that may prevent impurity penetration and form a planar surface. For example, at least one of a silicon nitride layer $SiN_x$, a silicon oxide layer $SiO_2$, and a silicon oxynitride layer $SiO_xN_y$ may be used as the buffer layer 120. The buffer layer 120 may be omitted depending on the type of substrate member 110 and fabrication process conditions.

The driving semiconductor layer 132 may be formed on the buffer layer 120. The driving semiconductor layer 132 may be formed as a polysilicon layer. Also, the driving semiconductor layer 132 may include a channel area 135, a source area 136, and a drain area 137. The source area 136 and the drain area 137 may be disposed at the sides of the channel area 135. The channel area may be undoped, and the source area 136 and the drain area 137 may be doped with a P-type impurity (p+). Here, a doped ion material may include a P-type impurity, e.g., boron. Generally, $B_2H_6$ may be used. Here, such an impurity may vary depending on the type of thin film transistor.

Although a TFT having a PMOS structure using a P-type impurity may be used as the driving TFT 20 in an embodiment, the embodiments are not limited thereto. Therefore, a TFT having an NMOS structure and/or a TFT having a PMOS structure may be used as the driving TFT 20.

Although the driving TFT 20 shown in FIG. 2 may be a polycrystal TFT having a polysilicon layer, a switching TFT 10 (not shown in FIG. 2) may be a polycrystal TFT or an amorphous TFT having an amorphous silicon layer.

A gate insulating layer 140 made of, e.g., a silicon nitride ($SiN_x$) or a silicon oxide ($SiO_2$), may be formed on the driving semiconductor layer 132. A gate wire having the driving gate electrode 155 may be formed on the gate insulating layer 140. The gate wire may further include a gate line 151 (shown in FIG. 1), the first sustain electrode 158, and other wires. The driving gate electrode 155 may overlap at least a part of the driving semiconductor layer 132 and, particularly, may overlap with the channel area 135.

An interlayer insulating layer 160 may be formed on the gate insulating layer 140, and the interlayer insulating layer 160 may cover the driving gate electrode 155. The gate insulating layer 140 and the interlayer insulating layer 160 may commonly include through-holes to expose the source area 136 and the drain area 137 of the driving semiconductor layer 132. The interlayer insulating layer 160 may include, e.g., silicon nitride ($SiN_x$) or silicon oxide ($SiO_2$), like the gate insulating layer 140.

A data wire may be formed on the interlayer insulating layer 160. The data wire may include the driving source electrode 176 and the driving drain electrode 177. The data wire may further include the data line 171 (shown in FIG. 1), the common power line 172, the second sustain electrode 178, and other wires. The driving source electrode 176 and the driving drain electrode 177 may respectively be connected to the source area 136 and the drain area 137 of the driving semiconductor layer 132 through through-holes.

As described above, the driving TFT 20 including the driving semiconductor layer 132, the driving gate electrode 155, the driving source electrode 176, and the driving drain electrode 177 may be formed.

However, the structure of the driving TFT 20 according to an embodiment is not limited thereto. The structure of the driving TFT 20 may be modified into various well-known structures that may be conveniently embodied by those skilled in the art.

On the interlayer insulating layer 160, the planarization layer 180 may be formed to cover data wires 172, 176, 177, and 178. The planarization layer 180 may remove and plane steps to beneficially improve the luminous efficiency of the organic light emitting element 70. Also, the planarization layer 180 may have a contact hole 182 to expose a part of the drain electrode 177.

The planarization layer 180 may include, e.g., polyacrylate resin, epoxy resin, phenolic resin, polyamide resin, polyimide resin, unsaturated polyester resin, polyphenylene ether resin, polyphenylene sulfide resin, and benzocyclobutene (BCB).

The pixel electrode 710 of the organic light emitting element 70 may be formed on the planarization layer 180. The pixel electrode 710 may be connected to the drain electrode 177 through the contact hole 182 of the planarization layer 180.

Also, the pixel defining layer 190 may be formed on the planarization layer 180. The pixel defining layer 190 may have an opening that exposes the pixel electrode 710. That is, the pixel electrode 710 may be disposed corresponding to the opening of the pixel defining layer 190.

The pixel defining layer 190 may include a resin, e.g., acryl-based polyacrylate or polyimide, and a silica type mineral.

The organic emission layer 720 may be formed on the pixel electrode 710 in the opening of the pixel defining layer 190. The common electrode 730 may be formed on the pixel defining layer 190 and the organic emission layer 720.

As described above, the organic light emitting element 70 having the pixel electrode 710, the organic emission layer 720, and the common electrode 730 may thus be formed.

One of the pixel electrode 710 and the common electrode 730 may be made of, e.g., a transparent conductive material, and the other may be made of, e.g., a translucent or reflective conductive material. The type of material used to form the pixel electrode 710 and the common electrode 730 may determine the type of OLED display 100, e.g., a top emission type, a bottom emission type, or a dual emission type. The OLED display 100 according to an embodiment may include a top emission type.

The transparent conductive material may include, e.g., indium tin oxide (ITO), indium zinc oxide (IZO), zinc oxide (ZnO), and indium oxide ($In_2O_3$). The reflective material may include, e.g., lithium (Li), calcium (Ca), lithium/calcium fluoride (LiF/Ca), lithium/aluminum fluoride (LiF/Al), aluminum (Al), silver (Ag), magnesium (Mg), or gold (Au).

The organic emission layer 720 may include, e.g., a small molecule organic material or a large molecule organic material. The organic emission layer 720 may be formed as a multilayer including, e.g., a hole injection layer (HIL), a hole transport layer (HTL), an emission layer, an electron transport layer (ETL), and an electron injection layer (EIL). That is, the hole injection layer (HIL) may be disposed at the pixel electrode 710, which may be an anode. The hole transport layer (HTL), the emission layer, the electron transport layer (ETL), and the electron injection layer (EIL) may be sequentially stacked thereon.

The liquid crystal polymer layer 310 and the polarizing plate 320 may be sequentially disposed on the organic light emitting element 70, and the sealing member 210 may be arranged to face the substrate member 110, thereby covering the driving TFT 20, the organic light emitting element 70, the liquid crystal polymer layer 310, and the polarizing plate 320.

Hereinafter, forming the liquid crystal polymer layer 310 on the organic light emitting element 70 will be described. The polarizing plate 320 may be attached at a side of the sealing member 210 facing the organic light emitting element 70, and molten liquid crystal polymer may be coated on the polarizing plate 320. Then, the molten liquid crystal polymer may be oriented by applying an electric field. Here, the liquid crystal polymer may be oriented to delay a phase of light passing through the liquid crystal polymer as much as about ¼ wavelength. The liquid crystal polymer layer 310 may be formed by solidifying the oriented liquid crystal polymer.

Then, the sealing member 210 may be arranged opposite to and above the substrate member 110 to make the liquid polymer layer 310 face the organic light emitting element 70.

Hereinafter, an organic light emitting diode (OLED) display 200 according to another embodiment will be described with reference to FIG. 3.

Figure 3:
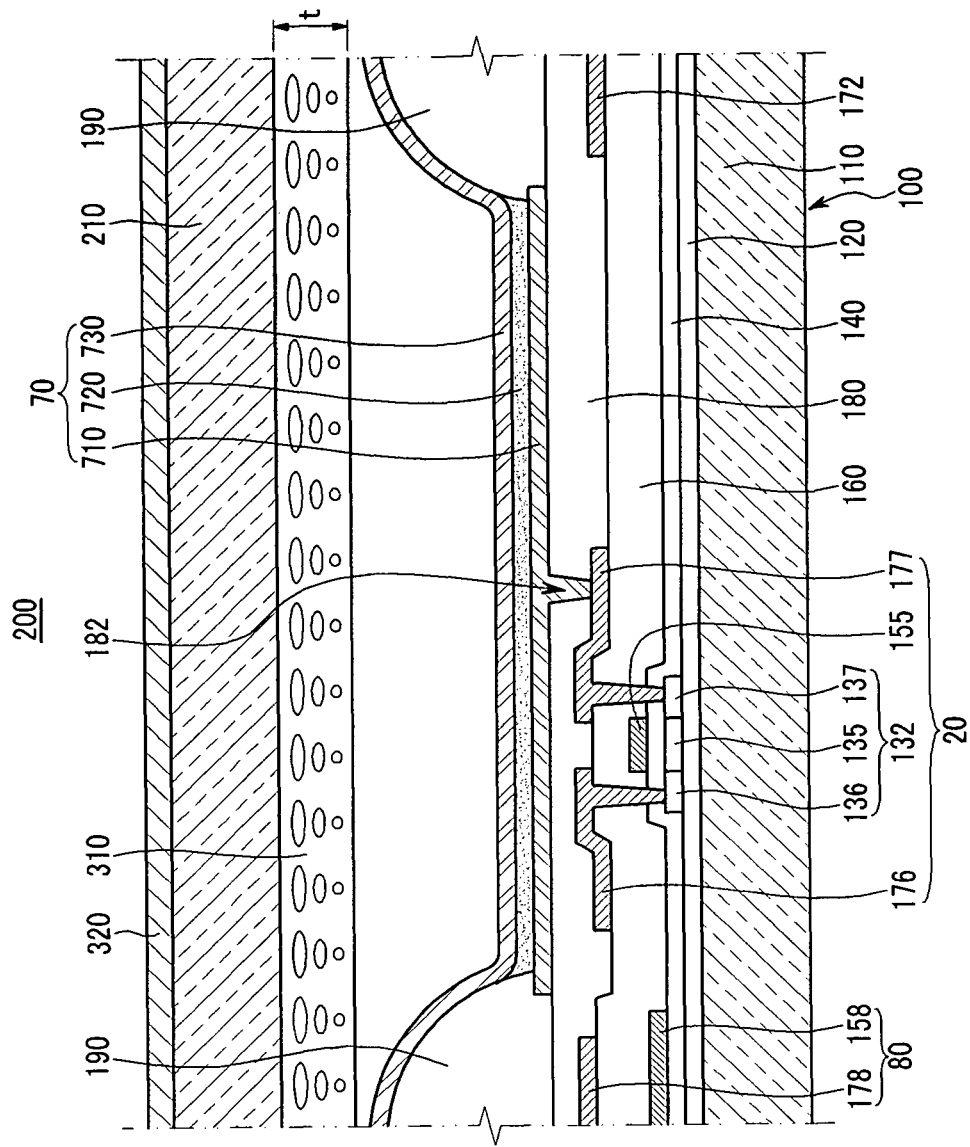
FIG. 3 illustrates a cross-sectional view of an OLED display according to another embodiment.

As shown in FIG. 3, the OLED display 200 may include a liquid crystal polymer layer 310 formed on the organic light emitting element 70 and a sealing member 210. The liquid crystal polymer layer 310 may have a thickness (t) of less than about 4 μm. The sealing member 210 may cover a driving TFT 20 formed on a substrate member 110, the organic light emitting element 70, and the liquid polymer layer 310 in order to seal them from the outside. The polarizing plate 320 may be disposed on the sealing member 210. Thus, the polarizing plate 320 may be disposed on a side of the sealing member 210, opposite to the side facing the liquid crystal polymer layer 310.

In more detail, the OLED display 200 according to the embodiment may include the liquid crystal polymer layer 310 on a first side of the sealing member 210 and the polarizing plate 320 on a second side of the sealing member 210. As described above, the liquid crystal polymer layer 310 and the polarizing plate 320 may be further stabilized by disposing the liquid crystal polymer layer 310 and the polarizing plate 320 at different sides of the sealing member 210. Thus, it may be possible to advantageously minimize defects in forming or attaching the liquid crystal polymer layer 310 and the polarizing plate 320 on the sealing member 210.

Also, it may not be necessary to dispose the liquid crystal polymer layer 310 adjacent to the sealing member 210 as shown in FIG. 3. Therefore, the liquid crystal polymer layer 310 may be disposed adjacent to the organic light emitting element 70.

According to the above described structure, the OLED display 200 may have improved visibility by suppressing reflection of external light while simultaneously minimizing an overall thickness. Also, defects may be avoided while forming and attaching the liquid crystal polymer layer 310 and the polarizing plate 320.

Hereinafter, forming the liquid crystal polymer layer 310 on the organic light emitting element 70 will be described. At first, molten liquid crystal polymer may be coated on a side of the sealing member 210, which may face the organic light emitting element 70. Then, the liquid crystal polymer may be oriented by applying an electric field. Here, the liquid crystal polymer may be oriented to delay a phase of light that passes through the liquid crystal polymer as much as about ¼ wavelength thereof. The liquid crystal polymer layer 310 may then be formed by solidifying the oriented liquid crystal polymer. Then, the polarization plate 320 may be attached on the side of the sealing member 210 that is opposite to the side where the liquid crystal polymer layer 310 is formed. The sealing member 210 may be arranged opposite to the substrate member 110 to make the liquid crystal polymer layer 310 face the organic light emitting element 70.

Hereinafter, an organic light emitting diode (OLED) display 300 according to another embodiment will be described with reference to FIG. 4.

Figure 4:
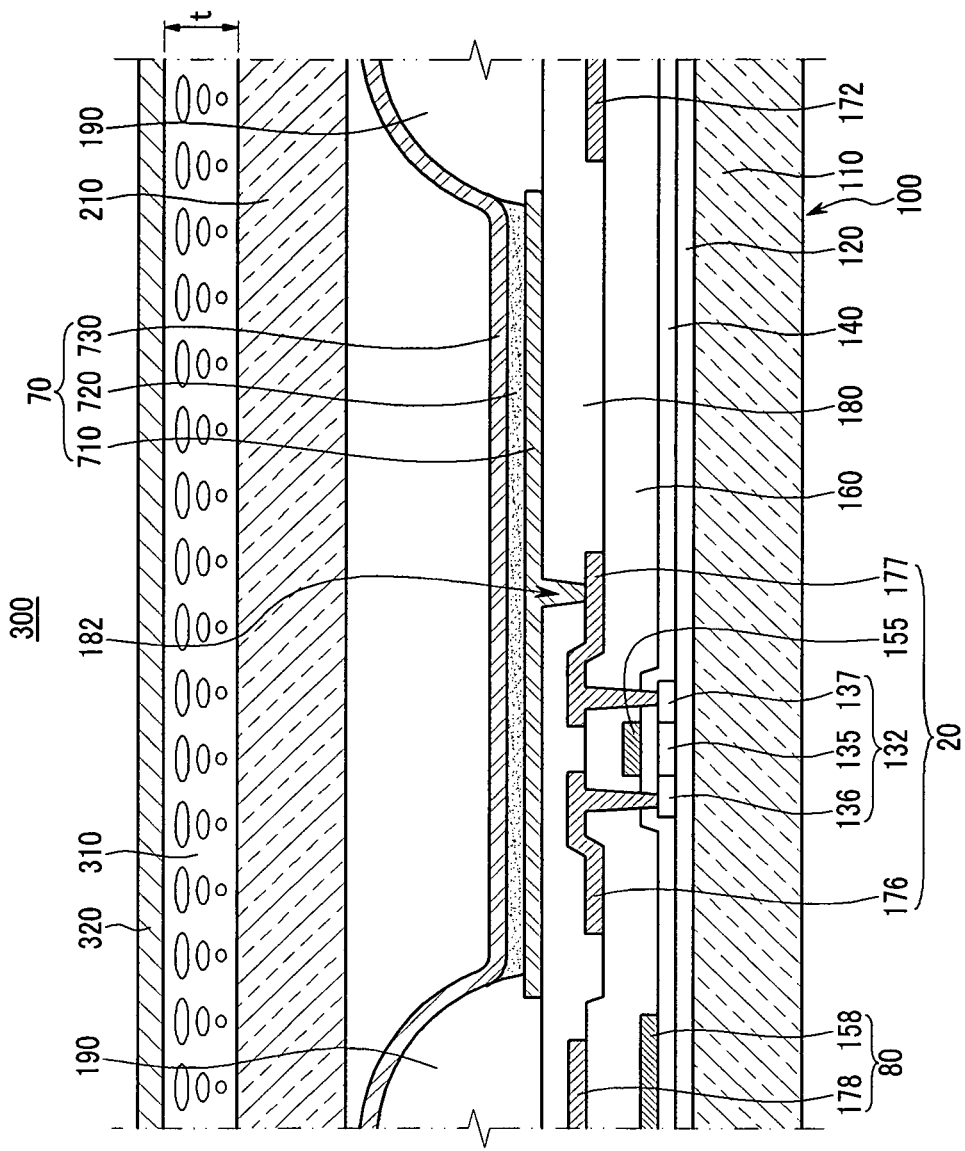
FIG. 4 illustrates a cross-sectional view of OLED display according to another embodiment.

As shown in FIG. 4, the OLED display 300 may include a sealing member 210 for protecting an organic light emitting element 70 from the outside by covering and sealing the organic light emitting element 70. The OLED display 300 may further include a liquid crystal polymer layer 310 having a thickness of less than about 4 μm and a polarizing plate 320 sequentially disposed on the sealing member 210. That is, the liquid crystal polymer layer 310 and the polarizing plate 320 may not be covered by the sealing member 210 in the OLED display 300 according to an embodiment.

According to the described structure, the OLED display 300 may have improved visibility by suppressing reflection of external light while simultaneously minimizing an overall thickness of the OLED display 300. Also, it may be possible to easily fix or replace the OLED display 300 if defects are found in forming or attaching the liquid crystal polymer layer 310 and the polarizing plate 320 on the sealing member 210.

Hereinafter, forming the liquid crystal polymer layer 310 on the organic light emitting element 70 will be described. At first, molten liquid crystal polymer may be coated on the side of the sealing member 210 that is opposite to the side that faces the organic light emitting element 70. Then, the molten liquid crystal polymer may be oriented by applying an electric field. Here, the liquid crystal polymer may be oriented to delay a phase of light that passes through as much as about ¼ wavelength thereof. Then, the oriented liquid crystal polymer layer 310 may be formed by solidifying the oriented liquid crystal polymer. After solidifying, the polarizing plate 320 may be attached on the liquid crystal polymer layer 310. Then, the sealing member 210 may be arranged opposite to the substrate member 110. In an implementation, the orientation of the liquid crystal polymer 310 may be fixed with respect to a plurality of, e.g., all of, the pixels of the resulting display, such that external light entering each of the plurality of the pixels is uniformly delayed by a predetermined amount, e.g., an amount produced by a phase shift of ¼ wavelength.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of manufacturing a display device, comprising:
   providing a housing;
   providing a substrate member in the housing;
   forming an organic light emitting element on the substrate member;
   forming a liquid crystal polymer layer on the organic light emitting element; and
   forming a polarizing plate between a viewing side of the display device and the liquid crystal polymer layer such that the polarizing plate linearly polarizes light,
   wherein:
   the liquid crystal polymer layer delays a phase of light passing therethrough by ¼ wavelength, and
   forming the liquid crystal polymer includes coating a molten liquid crystal polymer on the organic light emitting element, orienting the molten liquid crystal polymer by applying an electric field, and solidifying the liquid crystal polymer.

2. The method of manufacturing a display device as claimed in claim 1, further comprising forming a sealing member opposite to the substrate member and covering the organic light emitting element, wherein the liquid crystal polymer layer is disposed between the organic light emitting element and the sealing member.

3. The method of manufacturing a display device as claimed in claim 2, wherein the polarizing plate is formed between the liquid crystal polymer layer and the sealing member.

4. The method of manufacturing a display device as claimed in claim 2, wherein the polarizing plate is formed on the sealing member.

5. The method of manufacturing a display device as claimed in claim 1, further comprising forming a sealing member opposite to the substrate member and covering the organic light emitting element, wherein the sealing member is disposed between the organic light emitting element and the liquid crystal polymer layer.

6. The method of manufacturing a display device as claimed in claim 5, wherein the polarizing plate is formed on the liquid crystal polymer layer.

7. The method of manufacturing a display device as claimed in claim 1, wherein the liquid crystal polymer layer has a thickness of less than about 4 gm.

* * * * *